US006750594B2

(12) United States Patent
Wong

(10) Patent No.: US 6,750,594 B2
(45) Date of Patent: Jun. 15, 2004

(54) PIEZOELECTRICALLY ACTUATED LIQUID METAL SWITCH

(75) Inventor: Marvin Glenn Wong, Woodland Park, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 16 days.

(21) Appl. No.: 10/137,691

(22) Filed: May 2, 2002

(65) Prior Publication Data

US 2003/0205950 A1 Nov. 6, 2003

(51) Int. Cl.[7] .......................... H01L 41/08; H01H 51/22

(52) U.S. Cl. ........................ 310/328; 310/363; 200/181

(58) Field of Search ................................ 310/328, 363, 310/365; 200/181

(56) References Cited

U.S. PATENT DOCUMENTS

| | | | | |
|---|---|---|---|---|
| 2,312,672 A | | 3/1943 | Pollard, Jr. | 335/58 |
| 2,564,081 A | | 8/1951 | Schilling | 335/56 |
| 3,430,020 A | * | 2/1969 | Von Tomkewitsch et al. | 200/181 |
| 3,529,268 A | | 9/1970 | Rauterberg | 335/56 |
| 3,600,537 A | | 8/1971 | Twyford | 200/407 |

(List continued on next page.)

FOREIGN PATENT DOCUMENTS

| | | | |
|---|---|---|---|
| EP | 0593836 A1 | 4/1994 | G02B/6/28 |
| FR | 2418539 | 9/1979 | H01H/57/00 |
| FR | 2458138 | 12/1980 | H01H/29/18 |
| FR | 2667396 | 4/1992 | G01L/23/01 |
| JP | SHO 36-18575 | 10/1961 | |
| JP | SHO 47-21645 | 10/1972 | |
| JP | 62-276838 | 12/1987 | H01L/21/60 |
| JP | 63-294317 A | 12/1988 | B65B/11/30 |
| JP | 8-125487 | 5/1996 | H03H/9/17 |
| JP | 9-161640 | 6/1997 | |
| WO | WO99/46624 | 12/1999 | G02B/26/02 |

OTHER PUBLICATIONS

Marvin Glenn Wong, "Laser Cut Channel Plate For A Switch", Patent application (SN: 10/317932 filed Dec. 12, 2002), 11 pages of specifications, 5 pages of claims, 1 page of abstract, and 4 sheets of formal drawings (Fig. 1–10).

Homi C. Bhedwar et al., "Ceramic Multilayer Package Fabrication", Nov. 1989, Electronic Materials Handbook, vol. 1 Packaging, Section 4: pp. 460–469.

Marvin Glenn Wong, "A Piezoelectricaly Actuated Liquid Metal Switch", May 2, 2002, patent application (pending), 12 pages of specification, 5 pages of claims, 1 page of abstract, and 10 sheets of drawings (Fig. 1–10).

Jonathan Simon et al., "A Liquid–Filled Microrelay With A Moving Mercury Microdrop", Journal of Microelectromechanical Systems, vol. 6, No. 3, Sep. 1977, pp. 208–216.

Joonwon Kim et al., "A Micromechanical Switch With Electrostatically Driven Liquid–Metal Droplet", 4 pages.

TDB–ACC–No.: NBB406827, "Integral Power Resistors For Aluminum Substrate", IBM Technical Disclosure Bulletin, Jun. 1984, US, vol. 27, Issue No. 1B, p. 827.

*Primary Examiner*—Thomas M. Dougherty
(74) *Attorney, Agent, or Firm*—Regan L. Trumper

(57) ABSTRACT

In accordance with the invention, a piezoelectrically actuated relay that switches and latches by means of a liquid metal is disclosed. The relay operates by means of a plurality of shear mode piezoelectric elements used to cause a pressure differential in a pair of fluid chambers. Differential pressure is created in the chambers by contracting and expanding the chambers due to action by the piezoelectric elements. The differential pressure causes the liquid metal drop to overcome the surface tension forces that would hold the bulk of the liquid metal drop in contact with the contact pad or pads near the actuating piezoelectric element. The switch latches by means of surface tension and the liquid metal wetting to the contact pads.

23 Claims, 10 Drawing Sheets

U.S. PATENT DOCUMENTS 3,639,165 A 2/1972 Rairden, III ................ 428/433
3,657,647 A 4/1972 Beusman et al. ............. 324/94
4,103,135 A 7/1978 Gomez et al. .............. 200/135
4,200,779 A * 4/1980 Zakurdaev et al. ......... 200/187
4,238,748 A 12/1980 Goullin et al. ................ 335/56
4,245,886 A 1/1981 Kolodzey et al. ............. 385/19
4,336,570 A 6/1982 Brower et al. ................. 362/4
4,419,650 A 12/1983 John .......................... 337/119
4,434,337 A 2/1984 Becker ....................... 200/220
4,475,033 A 10/1984 Willemsen et al. ...... 250/201.1
4,505,539 A 3/1985 Auracher et al. ............. 385/14
4,582,391 A 4/1986 Legrand ...................... 385/17
4,628,161 A 12/1986 Thackrey ................. 200/61.47
4,652,710 A 3/1987 Karnowsky et al. ........ 200/235
4,657,339 A 4/1987 Fick ............................ 385/22
4,742,263 A 5/1988 Harnden, Jr. et al. ....... 310/331
4,786,130 A 11/1988 Georgiou et al. ............. 385/48
4,797,519 A 1/1989 Elenbaas .................... 200/226
4,804,932 A 2/1989 Akanuma et al. ............. 335/38
4,988,157 A 1/1991 Jackel et al. .................. 385/17
5,278,012 A 1/1994 Yamanaka et al. ............ 430/30
5,415,026 A 5/1995 Ford .......................... 73/23.2
5,502,781 A 3/1996 Li et al. ........................ 385/4
5,644,676 A 7/1997 Blomberg et al. .......... 392/407
5,667,823 A 9/1997 Carroll et al. .............. 338/309
5,675,310 A 10/1997 Wojnarowski et al. ......... 426/3
5,751,074 A 5/1998 Prior et al. ................. 307/118
5,751,552 A 5/1998 Scanlan et al. ............. 361/707
5,828,799 A 10/1998 Donald ........................ 385/16
5,841,686 A 11/1998 Chu et al. ..................... 365/51
5,849,623 A 12/1998 Wojnarowski et al. ...... 418/382
5,874,770 A 2/1999 Saia et al. .................. 257/536
5,875,531 A 3/1999 Nellissen et al. .......... 29/25.35
5,886,407 A 3/1999 Polese et al. ............... 257/706
5,889,325 A 3/1999 Uchida et al. .............. 257/724
5,912,606 A 6/1999 Nathanson et al. ........... 335/47
5,915,050 A 6/1999 Russell et al. ................. 385/7
5,972,737 A 10/1999 Polese et al. ............... 800/266
5,994,750 A 11/1999 Yagi ........................... 438/122
6,021,048 A 2/2000 Smith ......................... 257/415
6,180,873 B1 1/2001 Bitko ......................... 361/736
6,201,682 B1 3/2001 Mooij et al. ............. 361/306.1
6,207,234 B1 3/2001 Jiang .......................... 427/333
6,212,308 B1 4/2001 Donald ........................ 385/16
6,225,133 B1 5/2001 Yamamichi et al. ........... 438/3
6,278,541 B1 8/2001 Baker ......................... 359/291
6,304,450 B1 10/2001 Dibene, II et al. .......... 361/704
6,320,994 B1 11/2001 Donald et al. ................ 385/16
6,323,447 B1 11/2001 Kondoh et al. ............. 200/182
6,351,579 B1 2/2002 Early et al. ................... 385/18
6,356,679 B1 3/2002 Kapany ....................... 385/18
6,373,356 B1 4/2002 Gutierrez et al. ............. 335/47
6,396,371 B2 * 5/2002 Streeter et al. ............... 335/78
6,408,112 B1 6/2002 Bartels ........................ 385/16
6,446,317 B1 9/2002 Figueroa et al. ........... 29/25.42
6,453,086 B1 9/2002 Tarazona ..................... 385/20
6,470,106 B2 10/2002 McClelland et al. .......... 385/16
6,487,333 B2 11/2002 Fouquet et al. ............... 385/18
6,501,354 B1 12/2002 Gutierrez et al. ........... 200/193
6,512,322 B1 * 1/2003 Fong et al. ................. 310/328
6,515,404 B1 * 2/2003 Wong ......................... 310/328
6,516,504 B2 2/2003 Schaper ..................... 29/25.42
6,559,420 B1 5/2003 Zarev ......................... 219/209
6,633,213 B1 * 10/2003 Dove .......................... 335/78
2002/0168133 A1 11/2002 Saito ........................... 385/16
2003/0035611 A1 2/2003 Shi ............................. 385/16

* cited by examiner

SECTION A–A

PIEZOELECTRICALLY ACTUATED LIQUID METAL SWITCH

BACKGROUND

Piezoelectric materials and magnetostrictive materials (collectively referred to below as "piezoelectric materials") deform when an electric field or magnetic field is applied. Thus piezoelectric materials, when used as an actuator, are capable of controlling the relative position of two surfaces.

Piezoelectricity is the general term to describe the property exhibited by certain crystals of becoming electrically polarized when stress is applied to them. Quartz is a good example of a piezoelectric crystal. If stress is applied to such a crystal, it will develop an electric moment proportional to the applied stress.

This is the direct piezoelectric effect. Conversely, if it is placed in an electric field, a piezoelectric crystal changes its shape slightly. This is the inverse piezoelectric effect.

One of the most used piezoelectric materials is the aforementioned quartz. Piezoelectricity is also exhibited by ferroelectric crystals, e.g. tourmaline and Rochelle salt. These already have a spontaneous polarization, and the piezoelectric effect shows up in them as a change in this polarization. Other piezoelectric materials include certain ceramic materials and certain polymer materials. Since they are capable of controlling the relative position of two surfaces, piezoelectric materials have been used in the past as valve actuators and positional controls for microscopes. Piezoelectric materials, especially those of the ceramic type, are capable of generating a large amount of force. However, they are only capable of generating a small displacement when a large voltage is applied. In the case of piezoelectric ceramics, this displacement can be a maximum of 0.1% of the length of the material. Thus, piezoelectric materials have been used as valve actuators and positional controls for applications requiring small displacements.

Two methods of generating more displacement per unit of applied voltage include bimorph assemblies and stack assemblies. Bimorph assemblies have two piezoelectric ceramic materials bonded together and constrained by a rim at their edges, such that when a voltage is applied, one of the piezoelectric materials expands. The resulting stress causes the materials to form a dome. The displacement at the center of the dome is larger than the shrinkage or-expansion of the individual materials. However, constraining the rim of the bimorph assembly decreases the amount of available displacement. Moreover, the force generated by a bimorph assembly is significantly lower than the force that is generated by the shrinkage or expansion of the individual materials.

Stack assemblies contain multiple layers of piezoelectric materials interlaced with electrodes that are connected together. A voltage across the electrodes causes the stack to expand or contract. The displacements of the stack are equal to the sum of the displacements of the individual materials. Thus, to achieve reasonable displacement distances, a very high voltage or many layers are required. However, conventional stack actuators lose positional control due to the thermal expansion of the piezoelectric material and the material(s) on which the stack is mounted.

Due to the high strength, or stiffness, of piezoelectric material, it is capable of opening and closing against high forces, such as the force generated by a high pressure acting on a large surface area. Thus, the high strength of the piezoelectric material allows for the use of a large valve opening, which reduces the displacement or actuation necessary to open or close the valve.

With a conventional piezoelectrically actuated relay, the relay is "closed" by moving a mechanical part so that two electrode components come into electrical contact. The relay is "opened" by moving the mechanical part so that the electrode components are no longer in electrical contact. The electrical switching point corresponds to the contact between the electrode components of the solid electrodes.

Liquid metal micro switches have been developed that use liquid metal as the switching element and the expansion of a gas when heated to actuate the switching function. The liquid metal has some advantages over other micromachined technologies, such as the ability to switch relatively high power approximately 100 mW) using metal-to-metal contacts without microwelding, the ability to carry this much power without overheating the switch mechanism and adversely affecting it, and the ability to latch the switching function. However, the use of a heated gas to actuate the switch has several disadvantages. It requires a relatively large amount of power to change the state of the switch, the heat generated by switching must be rejected effectively if the switch duty cycle is high, and the actuation speed is relatively slow, i.e., the maximum switching frequency is limited to several hundred Hertz.

SUMMARY

The present invention uses a piezoelectric method to actuate liquid metal switches. The actuator of the invention uses piezoelectric elements in a sheart mode rather than in a bending mode. A piezoelectric driver in accordance with the invention is a capacitive device which stores energy rather than dissipating energy. As a result, power consumption is much lower, although the required voltages to drive it may be higher. Piezoelectric pumps may be used to pull as well as push, so there is a double-acting effect not available with an actuator that is driven solely by the pushing effect of expanding gas. Reduced switching time results from use of piezoelectric switches in accordance with the invention.

A piezoelectrically actuated liquid metal switch in accordance with the invention is comprised of a plurality of layers. Liquid metal is contained within a channel in one layer and contacts switch pads on a circuit substrate. The amount and location of the liquid metal in the channel is such that only two pads are connected at a time. The metal is movable so that it contacts the center pad and either end pad by creating an increase in pressure between the center pad and the first end pad such that the liquid metal breaks and part of it moves to connect to the other end pad. A stable configuration results due to the latching effect of the liquid metal as it wets to the pads and is held in place by surface tension.

An inert and electrically nonconductive liquid fills the remaining space in the switch. The pressure increase described above is generated by the motion of a piezoelectric pump or pumps. The type of pump of the invention utilized the shearing action of piezoelectric elements in a pumping cavity to create positive and negative volume changes. These actions may cause pressure decreases, as well as increases, to assist in moving the liquid metal.

DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION OF THE INVENTION

Figure 1:
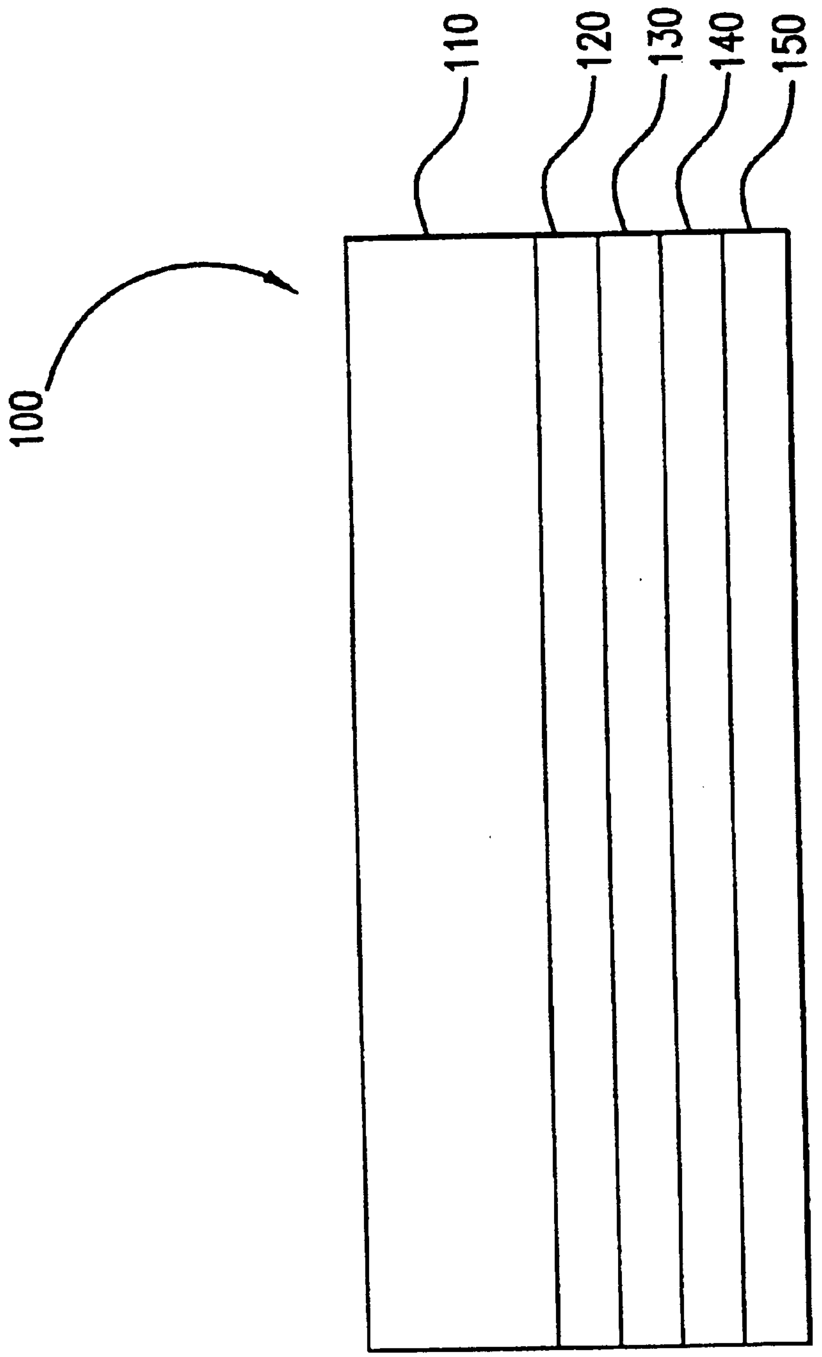
FIG. 1 shows a side view of the layers of a piezoelectric metal switch in accordance with the invention.

FIG. 1 is a side view of an embodiment of the invention showing five layers of a relay 100. The top layer 110 is an actuator fluid reservoir layer and acts as a reservoir for fluid used in the actuator. The second layer 120 is an orifice layer. The orifice layer is optional and provides orifices for between the top layer 110 and the layers below. The third layer 130 is a piezoelectric layer which houses a piezoelectric switching mechanism. The fourth layer 140 is a liquid metal channel layer and houses a liquid metal used in the switching mechanism. The substrate layer 150 acts as a base and provides a common foundation for a plurality of circuit elements that may be present.

Figure 2:
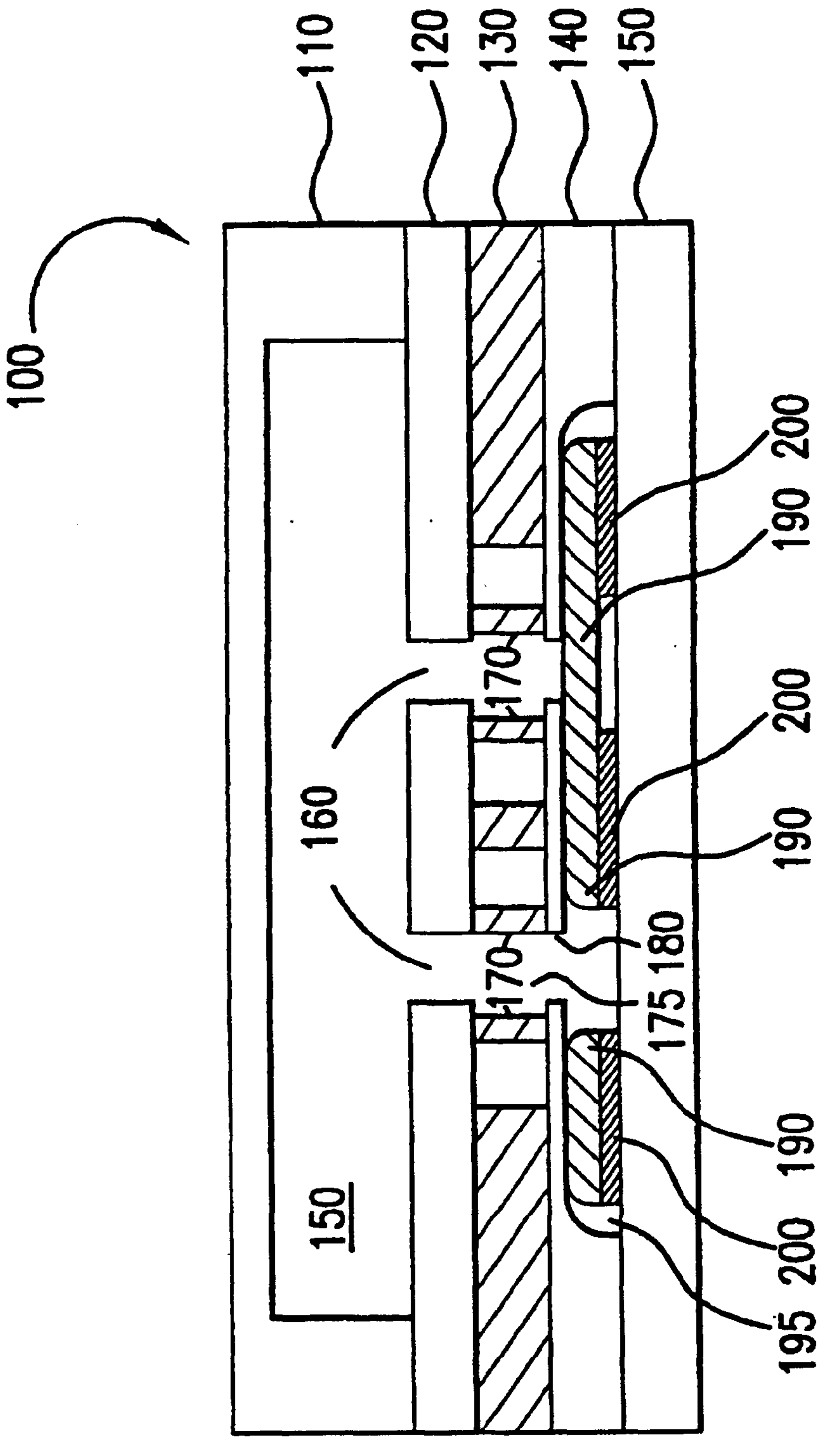
FIG. 2 shows a side cross section of a side view of the layers of a piezoelectric switch in accordance with the invention.

FIG. 2 shows a cross sectional view of an embodiment of an actuator 100 in accordance with the invention. FIG. 2 is a cross sectional view of FIG. 1. The actuator fluid reservoir layer 110 has a chamber 150 that contains a volume of actuator fluid. The actuator fluid is an inert, electrically non-conductive fluid. This fluid is preferably a low viscosity inert organic liquid such as a low w molecular weight perfluorocarbon such as is found in the 3M line of Fluorinert products. It may alternatively consist of a light mineral or synthetic oil, for example. The orifice layer 120 is adjacent to the reservoir layer 110. Two openings 160 in the orifice layer 120 coincide with openings in the reservoir 150. The orifice layer 120 is optional and provides a boundary layer between the reservoir layer 110 and the piezoelectric layer 130.

The piezoelectric layer 130 houses a plurality of piezoelectric elements 170 utiized in the relay 100. Each of the of piezoelectric elements 170 in FIG. 2 is paired with another of the piezoelectric elements 170 which form sets of pairs of piezoelectric elements 170 Each pair of piezoelectric elements 170 form a chamber 175. Each chamber 175 coincide with the orifices 160 so that fluid can flow from the reservoir 150 into and out of the chamber 175. The piezoelectric layer 130 has openings 180 that coincide with the chambers 175 opposite the orifices 160.

The liquid metal layer 140 comprises a liquid metal 190 which is contained within a channel 195 and a set of switch contact pads 200 located on the circuit substrate 150. The space in the channel 195 which is not filled with liquid metal 190 is filled with the fluid. The liquid metal is inert and electrically conductive. The amount and location of the liquid metal 190 is such that only two pads 200 are connected at a time. The center pad 200 will always be contacted and either the left or right pad 200. In the embodiment of the invention shown in FIG. 2, the liquid metal 190 is in contact with the center pad 200 and the right pad 200. The liquid metal 190 is moved to contact the left pad 200 by the action of the piezoelectric elements 160 which causes pressure differentials in chambers 175.

Bending of the piezoelectric elements 170 causes either an increase or a decrease in chamber 175. An increase in pressure in chamber 175 causes the liquid metal 190 to move leftward until it is contacting the center pad 200 and the left pad 200. The pumping actions of the piezoelectric elements create either a positive or a negative volume, and pressure, change in chambers 175. When the right set of piezoelectric elements 170 causes an increase in pressure—decreased volume—the left side can cause a decrease in pressure-increased volume. The opposite movements of the two sets of piezoelectric elements 160 assist in movement of the liquid metal 200.

In a preferred embodiment of the invention, the liquid metal 190 is mercury. In an alternate preferred version of the invention, the liquid metal is an alloy containing gallium.

In operation, the switching mechanism of the invention operates by shear mode displacement of the piezoelectric elements 170. An electric charge is applied to the piezoelectric elements 170 which causes the elements 170 to bend by shear mode displacement. Each set of piezoelectric element 170 work together. As discussed above, the bending action of the piezoelectric elements 170 can be on an individual basis, i.e. each set separately—or in a cooperative manner—both sets together. Inward bending of the piezoelectric elements 160 of one of the sets causes an increase of pressure and decrease of volume in the chamber 180 directly below the outward bending set. This change in pressure/volume causes displacement of the moveable liquid metal 190. To increase the effectiveness, the piezoelectric elements of the other set can bend inward at the same time. Reversing the bending motion of the piezoelectric elements 160 causes the liquid metal 190 to displace in the opposite direction. The piezoelectric elements 160 are relaxed, i.e. the electric charge is removed, once the liquid metal 190 has displaced. The liquid metal 190 wets to the contact pads 200 causing a latching effect. When the electric charge is removed from the piezoelectric elements 160, the liquid does not return to its original position but remains wetted to the contact pad 200.

Figure 3B:
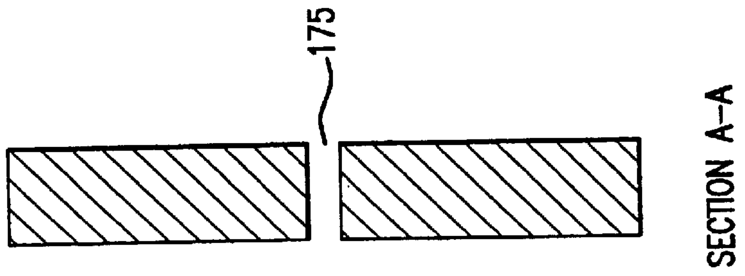
FIG. 3B is a side-sectional view of the orifice layer.
Figure 3A:
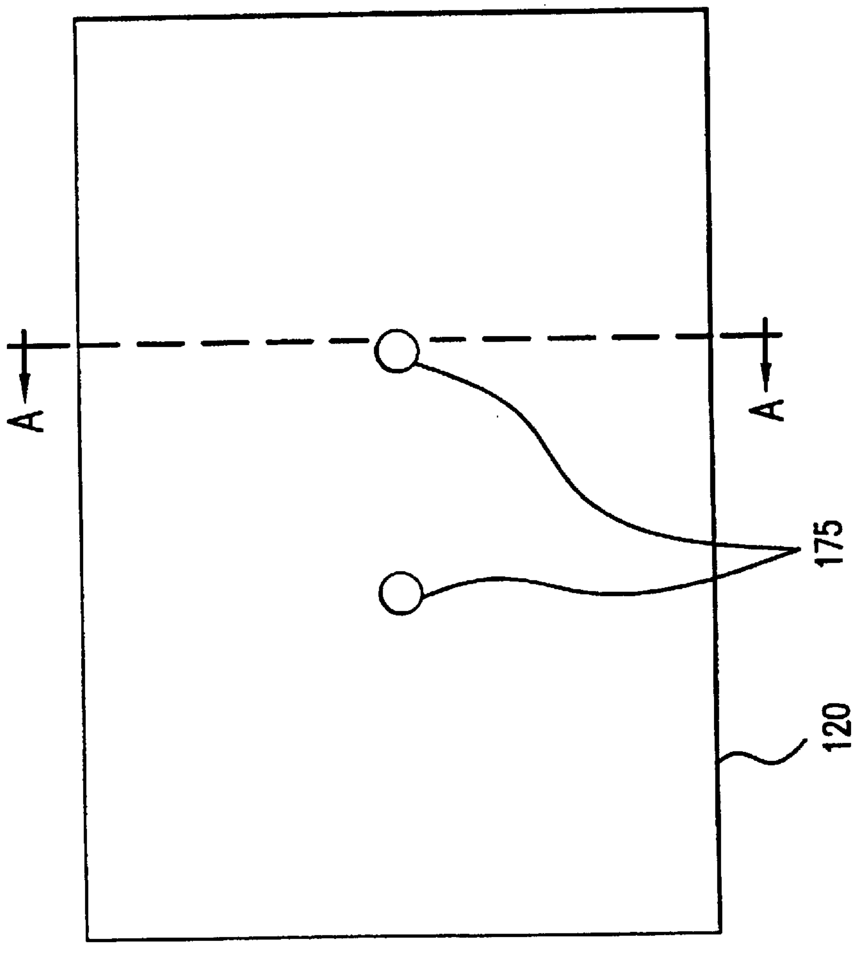
FIG. 3A shows a top level view of the orifice layer.

FIG. 3A is a top view of the orifice layer 120. The two orifices 160 provide flow restriction for the fluid between the reservoir 150 and the chambers 175 in the piezoelectric layer 130. FIG. 3B is a side sectional view at A—A of the orifice layer 120. The orifices 175 are shown extending through the layer 120.

Figure 4:
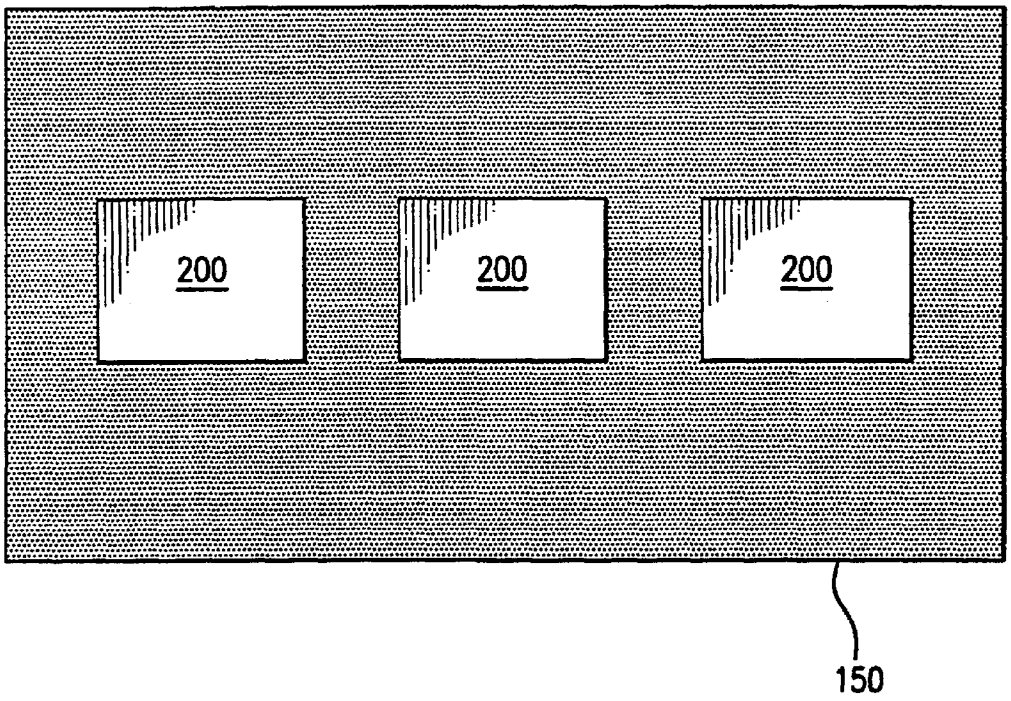
FIG. 4 shows a top level view of the substrate layer with the switch contacts.

FIG. 4 shows a top level view of the substrate layer 150 with the switch contacts 200. The switch contacts 200 can be connected through the substrate 150 to solder balls (not shown) on the opposite side for the routing of signals. It is understood that there are alternatives to routing of signals. For instances, the signal routing can be placed in the substrate layer 150. It is also understood that the switch pads 200 in FIG. 2 are merely representative of the switch pads of the invention. Specifically, the substrate layer 150 and the switch pads 200 are not necessarily proportional to the switch pads and substrate layer in FIG. 4.

Figure 5B:
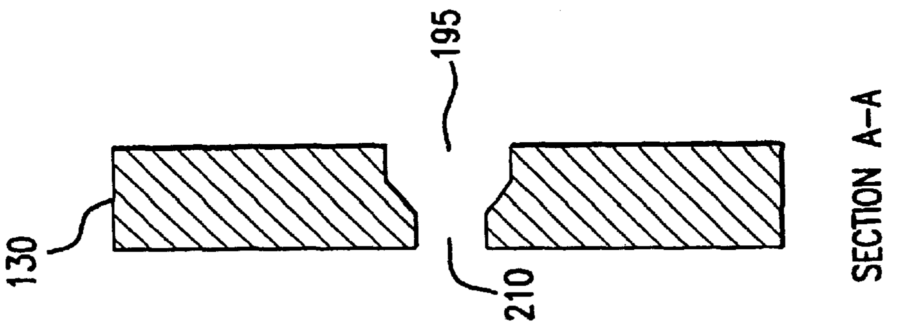
FIG. 5B is a side-sectional view of the liquid metal channel layer.
Figure 5A:
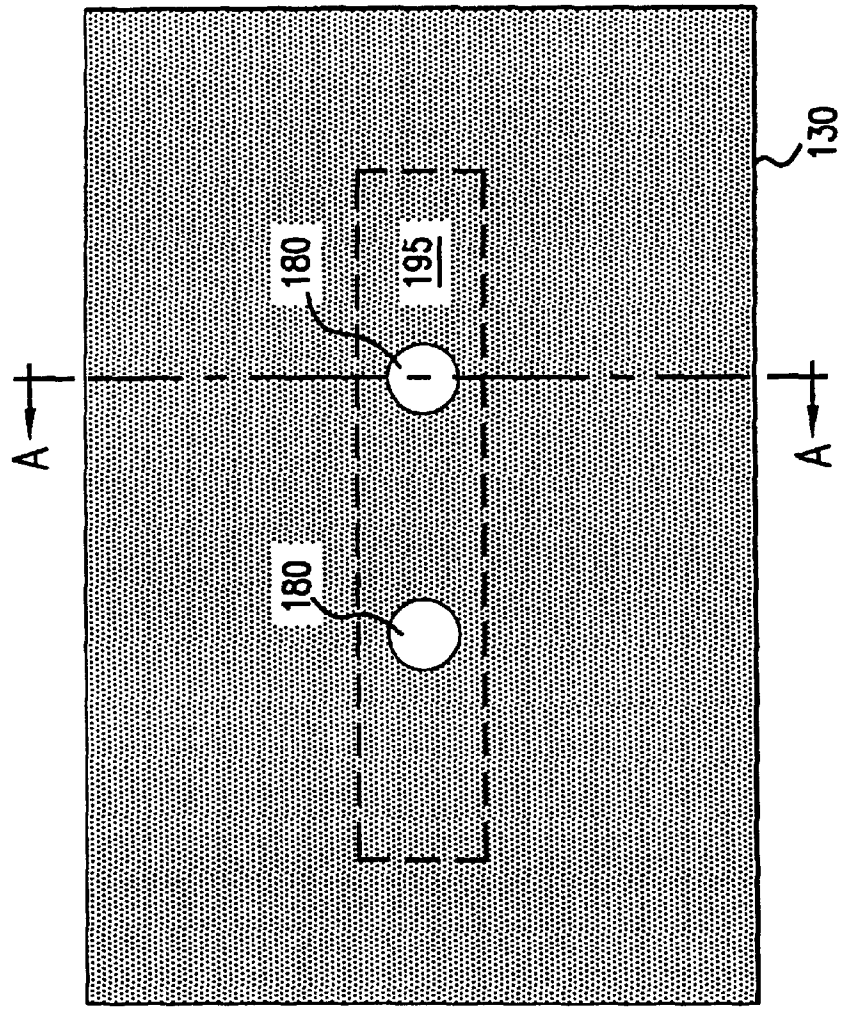
FIG. 5A is a top view of the liquid metal channel layer.

FIG. 5A is a top view of the liquid metal channel layer 130. The liquid metal layer 140 comprises the liquid metal channel 195 and a pair of through-holes 180 which act as the conduits for movement of liquid from the liquid metal channel 195 and the chamber 175 shown in FIG. 2. FIG. 4B is a side-sectional view of the liquid metal layer 140 at the A—A point. The liquid metal channel 195 is shown connecting to the through-hole 180.

Figure 6:
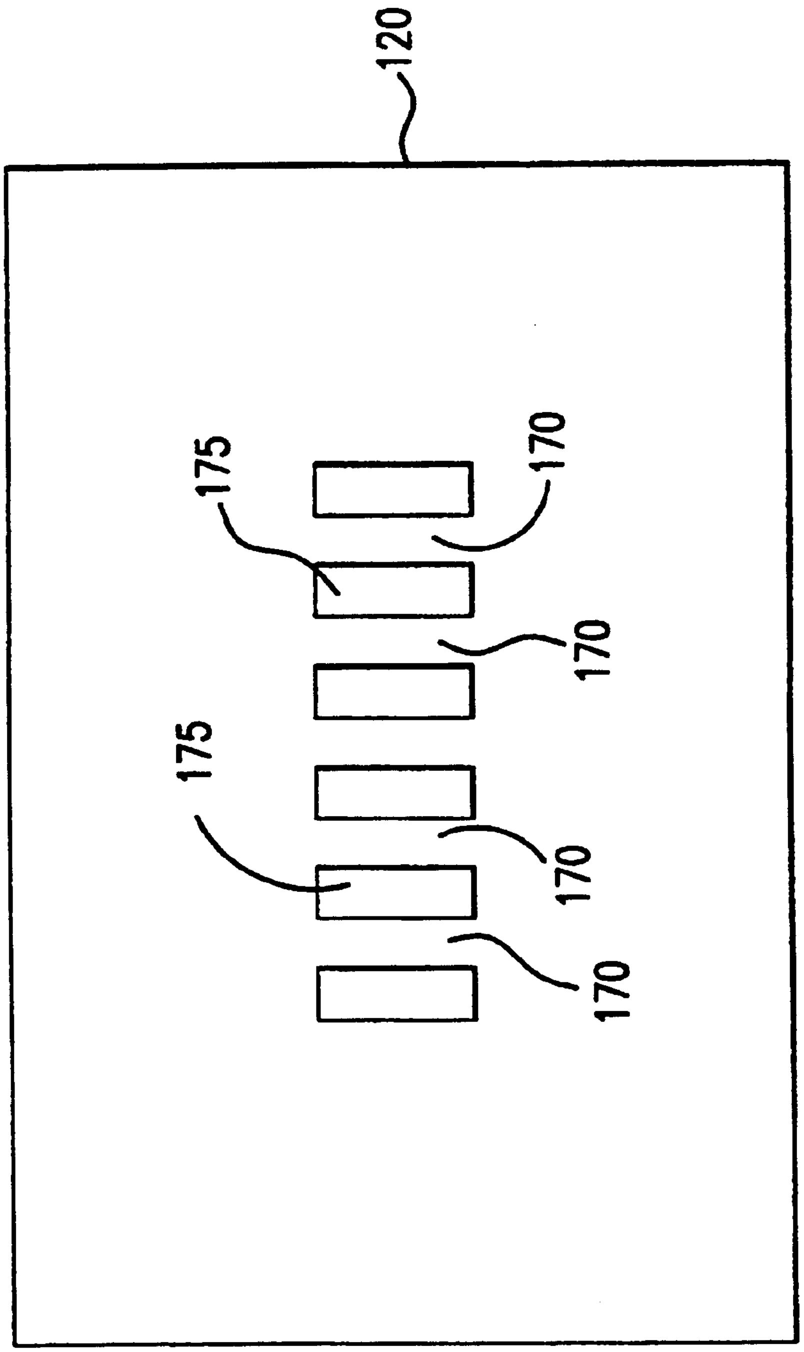
FIG. 6 is a top view of the piezoelectric layer showing two sets of piezoelectric elements.

FIG. 6 is a top view of the piezoelectric layer 120 showing two sets of piezoelectric elements 170. Each pair of piezoelectric elements 170 form a chamber 175. Each chamber 175 coincides with the orifices 160 (not shown) so that fluid can flow from the reservoir 150 (not shown) into and out of the chamber 175.

Figure 7:
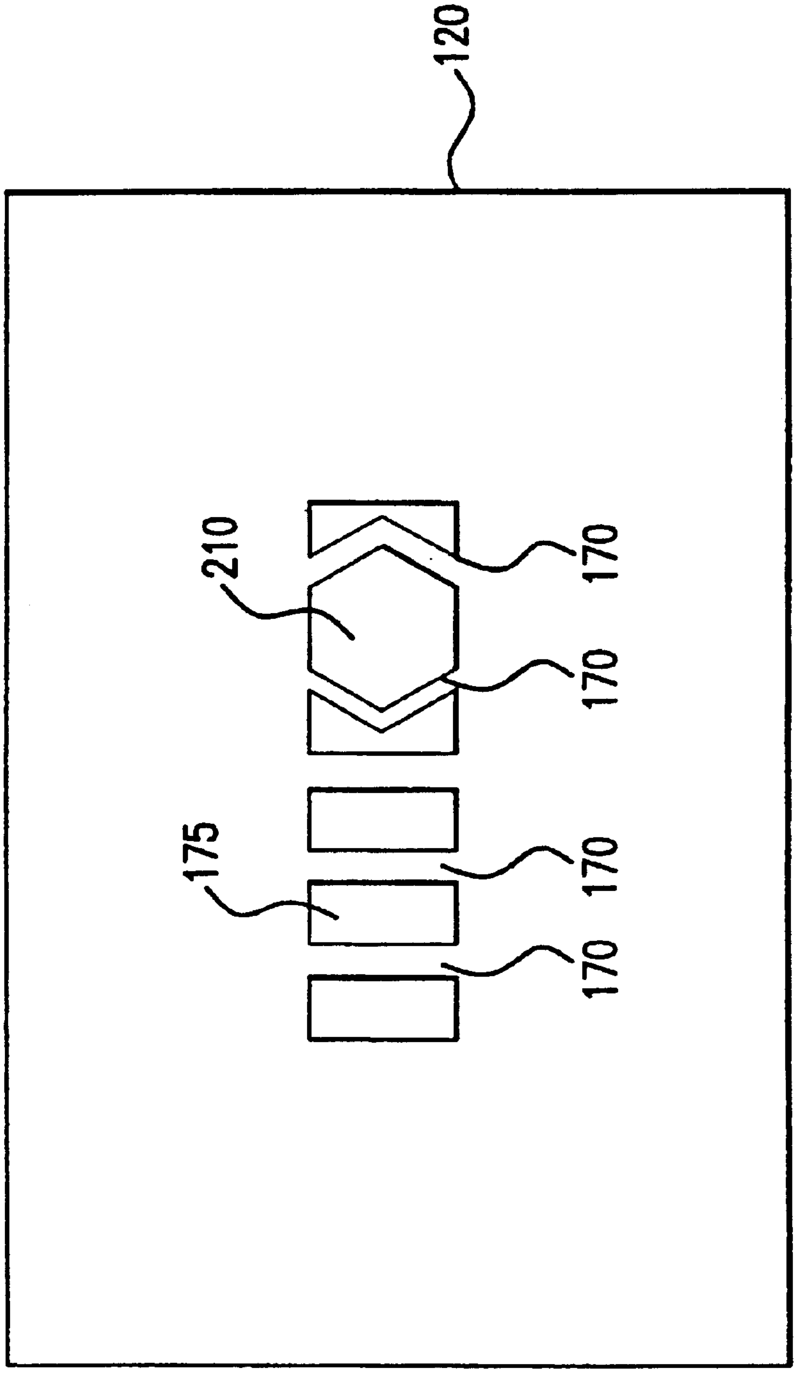
FIG. 7 is a top view of the piezoelectric layer showing the "switch actuator cavity" expanded for the right hand set of piezoelectric elements.

FIG. 7 shows a top view of the piezoelectric layer 120 showing two sets of piezoelectric elements 170. The pair of piezoelectric elements 170 on the right side of the figure have been activated to bend (deflect) outward. The deflected piezoelectric elements 170 form an expanded pumping cavity 210. The expanded pumping cavity 210 pulls fluid from the liquid metal channel 195 (not shown) causing liquid metal 190 (not shown) to be pulled toward the right side.

Figure 8:
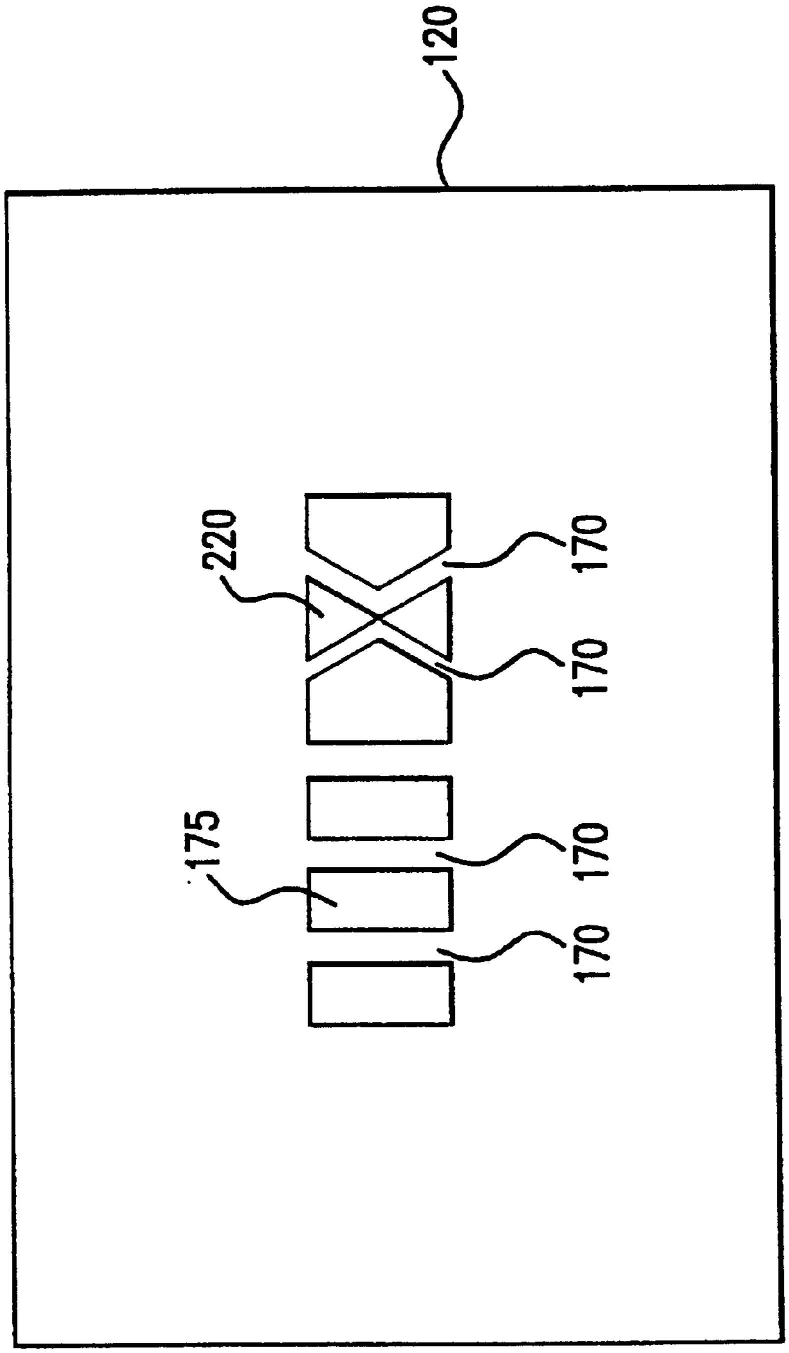
FIG. 8 is a top view of the piezoelectric layer showing the "switch actuator cavity" contracted for the right hand set of piezoelectric elements.

FIG. 8 shows a top view of the piezoelectric layer 120 showing two sets of piezoelectric elements 170. The pair of piezoelectric elements 170 on the right side of the figure have been activated to bend (deflect) inward. The deflected piezoelectric elements 170 form a contracted pumping cavity 220. The contracted pumping cavity 220 pushes fluid from the liquid metal channel 195 (not shown) causing liquid metal 190 (not shown) to be pushed toward the left side.

It is understood that the sets of piezoelectric elements 170 can work cooperatively. For instance, when one set of elements 170 deflects outward as shown in FIG. 7, the other set of elements 170 can deflect inward as shown in FIG. 8. Cooperative action increases the action produced on the fluid increasing the forces causing the liquid metal to move.

Figure 9B:
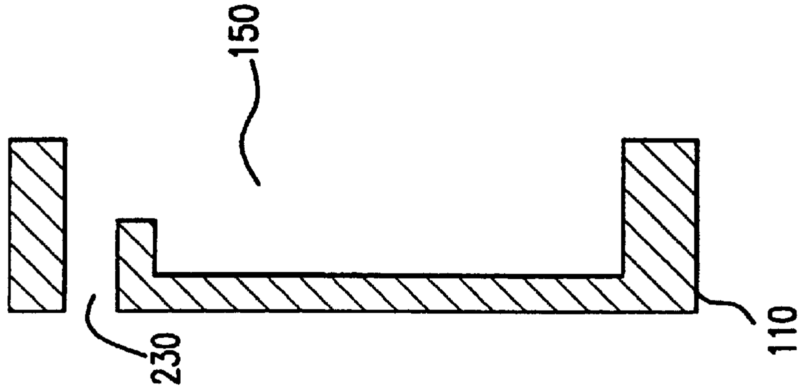
FIG. 9B shows a side-sectional view of the actuator fluid reservoir layer.
Figure 9A:
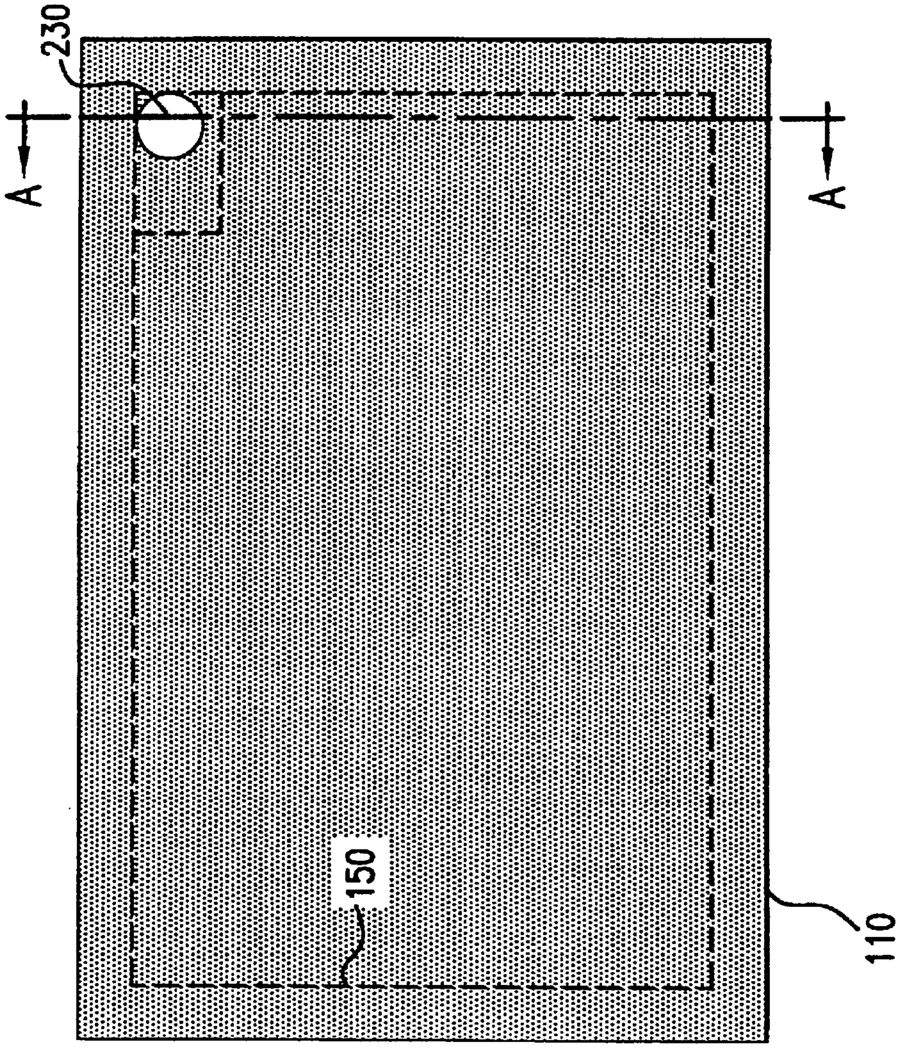
FIG. 9A shows a top view of the actuator fluid reservoir layer.

FIG. 9 shows a top view of the actuator fluid reservoir layer 110 with the reservoir 150 and a fill port 230. The fluid reservoir 150 is illustrated here as a single part in one embodiment of the invention. In an alternate embodiment of the invention, the fluid reservoir is made from multiple sections. The fluid reservoir 150 is a depository of the working fluid and has a compliant wall to keep pressure pulse interactions between pumping elements—crosstalk—to a minimum. The fluid reservoir 150 is filled after the switch assembly 100 has been assembled. The fill port 230 is sealed after the reservoir has been filled.

Figure 10:
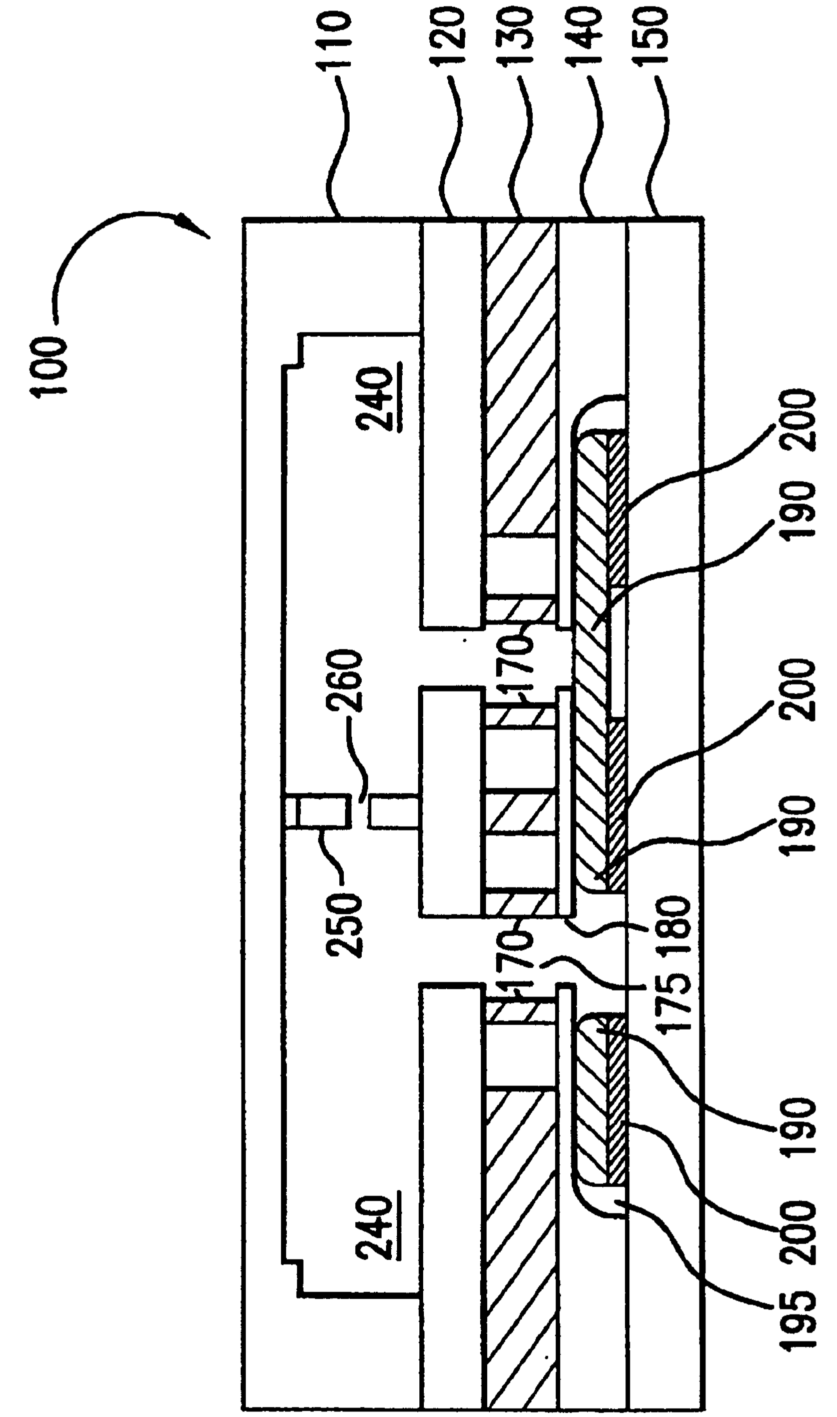
FIG. 10 shows an alternate side cross section of a side view of the layers of a piezoelectric switch in accordance with the invention.

FIG. 10 shows an alternate embodiment of the invention wherein the fluid reservoir comprises multiple compartments 240. The wall 250 separating the multiple compartments has a pressure relief port 260 which connects to both of the compartments 240 which equalizes the pressure between compartments 240, and each of the compartments 240 has a compliant exterior wall which keeps pressure pulse interactions between pumping elements—crosstalk—to a minimum.

While only specific embodiments of the present invention have been described above, it will occur to a person skilled in the art that various modifications can be made within the scope of the appended claims.

What is claimed is:

1. A piezoelectric activated relay comprising:

a liquid metal channel;

a first and second set of piezoelectric elements, each of said set of piezoelectric elements forming sidewalls to a first and second chamber and each of said chambers being connected to said channel via a first and second conduit respectively;

a first, second and third contact pad equally separated from each other, each of said contact pads having at least a portion within the chamber; and a moveable conductive liquid within the channel, a first portion of the liquid being wetted to the first of said contact pads and a portion of the liquid wetted to both the second and third of said contact pads;

wherein said chambers and said channel are filled with a fluid and wherein said portion of the liquid wetted to said second and third of said contact pads is moveable toward said portion wetted to the first of said contact pads.

2. The piezoelectric activated relay of claim 1 further comprising a fluid reservoir connected to each of said first and second chambers via a first and second through-hole.

3. The piezoelectric activated relay of claim 2 wherein each of said set of piezoelectric elements comprises a pair of shear mode piezoelectric elements that can bend toward or away from the cavity between them.

4. The piezoelectric activated relay of claim 3 wherein said fluid reservoir comprises a plurality of compartments wherein each of said plurality of compartments has compliant walls.

5. The piezoelectric activated relay of claim 4 further comprising a relief port connecting said plurality of compartments.

6. The piezoelectric activated relay of claim 5 wherein said moveable conductive liquid is moveable by pressure differentials created within the first and second fluid chambers caused by activation of at least one set of the piezoelectric elements, said activation of said piezoelectric elements causing said piezoelectric elements to deflect in shear causing them to bend.

7. The piezoelectric activated relay of claim 5 wherein said moveable conductive liquid is moveable by pressure differentials created within the first and second fluid chambers caused by activation of both the first and second set of the piezoelectric elements cooperatively with each other.

8. The piezoelectric activated relay of claim 6 wherein said liquid metal is mercury.

9. The piezoelectric activated relay of claim 6 wherein said liquid metal is an alloy containing gallium.

10. The piezoeletric activated relay of claim 7 wherein said liquid metal is mercury.

11. The piezoelectric activated relay of claim 7 wherein said liquid metal is an alloy containing gallium.

12. The piezoelectric activated relay of claim 7 further comprising a fill port situated above said fluid reservoir.

13. A piezoelectric activated relay comprising:

a fluid reservoir layer comprising a fluid reservoir;

a piezoelectric layer laminated to said fluid reservoir layer, said piezoelectric layer comprising a first and second set of piezoelectric elements, each of said set of piezoelectric elements forming sidewalls to a first and second chamber and each of said chambers being connected to said channel via a first and second conduit respectively;

a liquid metal channel layer laminated to said piezoelectric layer, said channel layer comprising a liquid metal channel, a first via connecting said channel to the first of said chambers, a second via connecting said channel to the second of said chambers, a first, second and third contact pad equally separated from each other, each of said contact pads having at least a portion within the chamber and a moveable conductive liquid within the channel, a first portion of the liquid being wetted to the first of said of contact pads and a portion of the liquid wetted to both th second and third of said contact pads;

wherein said chambers and said channel are filled with a fluid and wherein said portion of the liquid wetted to said second and third of said contact pads is moveable toward said portion wetted to the first of said contact pads.

14. The piezoelectric relay of claim 13, wherein each of said first set of piezoelectric elements comprises at least two shear mode piezoelectric elements and said second set of piezoelectric elements comprises at least two shear mode piezoelectric elements.

15. The piezoelectric activated relay of claim 14 wherein said fluid reservoir comprises a single compartment.

16. The piezoelectric activated relay of claim 14 wherein said fluid reservoir comprises a plurality of compartments wherein each of said plurality of compartments has compliant walls.

17. The piezoelectric activated relay of claim 16, further comprising at least one relief port connecting each of said plurality of compartments with adjacent compartments.

18. The piezoelectric activated relay of claim 15 wherein said liquid metal is mercury.

19. The piezoelectric activated relay of claim 17 wherein said liquid metal is an alloy containing gallium.

20. The piezoelectric activated relay of claim 15 wherein said liquid metal is mercury.

21. The piezoelectic activated relay of claim 15 wherein said liquid metal is an alloy containing gallium.

22. The piezoelectric activated relay of claim 20 wherein said reservoir layer further comprises a fill port.

23. The piezoelectric activated relay of claim 21 wherein said reservoir layer further comprises a fill port.

* * * * *